US005720639A

United States Patent [19]

Stevenson

[11] Patent Number: 5,720,639

[45] Date of Patent: Feb. 24, 1998

[54] METHOD FOR MANUFACTURING ELECTROLUMINESCENT LAMP SYSTEMS

[75] Inventor: William Charles Stevenson, Calabasas, Calif.

[73] Assignee: American International Pacific Industries, Corp., Camarillo, Calif.

[21] Appl. No.: 482,302

[22] Filed: Jun. 7, 1995

[51] Int. Cl.[6] .............................. H10J 9/18; H05B 33/10

[52] U.S. Cl. .............................. 445/24; 445/58; 427/66

[58] Field of Search .............................. 445/24, 58; 427/66

[56] References Cited

U.S. PATENT DOCUMENTS

| | | | |
|---|---|---|---|
| 3,315,111 | 4/1967 | Jaffe et al. | 427/66 |
| 4,853,079 | 8/1989 | Simopoulos et al. | 427/66 |
| 5,116,270 | 5/1992 | Aizawa et al. | 445/24 |
| 5,469,019 | 11/1995 | Mori | 445/24 |
| 5,491,379 | 2/1996 | Dagle et al. | 427/66 |

*Primary Examiner*—P. Austin Bradley
*Assistant Examiner*—Jeffrey T. Knapp
*Attorney, Agent, or Firm*—Francis G. Rushford

[57] ABSTRACT

A method of manufacturing EL lamp systems is available which incorporates some of the processes used in manufacturing flexible, printed circuit boards with surface mounted components along with those used to form multilayered EL lamps. The EL lamp system produced by this method is suitable for a variety of graphics and low-cost consumer applications.

8 Claims, 6 Drawing Sheets

METHOD FOR MANUFACTURING ELECTROLUMINESCENT LAMP SYSTEMS

BACKGROUND OF THE INVENTION

1. Field of the Invention

The present invention relates to electroluminescent lamp systems and, more particularly, to a method for manufacturing electroluminescent lamp systems, which are suitable for many low-cost consumer and industrial applications.

2. Description of the Prior Art

As set forth in a prior application filed Feb. 22, 1995, the electroluminescent ("EL") lamp manufacturing techniques may be divided into two processes. The first is a screen printing process in which the lamp is constructed layer by layer. More particularly, the lamp is constructed using costly electroluminescent inks, clear conductive Indium Tin Oxide (ITO) transparent films, conductive ink compounds with a high volume of metallic silver in a water-repellent electrical insulating coating containing an ultra-violet light-activated polymer.

As noted therein, the screen printing process allows for intricate graphics, but has a high cost to manufacture, even in high volume applications. Adding the necessary control and/or power supply necessary to control and/or operate the silk screen electroluminescent lamp further increases the cost. Limiting the use of this process to create EL lamp systems having high luminescence or superior electrical characteristics.

The second process is the continuous lamination method. In this process, a first film, which supports a foil is passed below a metering roll or blade which applies an insulating layer of ink. A second transparent film that has been sputter coated with clear conductive ITO is similarly passed below a roller or blade, which applies a layer of phosphor ink. In order to achieve a uniform light output electrical characteristics, the thickness of the insulating and phosphorous layer must be precisely controlled, along with the phosphor grain dispersion in the phosphor layer. Thus, the continuous lamination method requires very tight control over ink rheology. While the continuous lamination method produces foil EL lamps, which are high performance, high priced lamps, typically unsuitable for graphics or other price-sensitive applications. Further, foil EL lamps are also thicker, and mechanically less flexible than screen printed EL lamps. Combining the EL lamps produced under either of these two methods with an electrical controls and/or power supply further increases the cost and has resulted in EL systems not being widely utilized.

Accordingly, there is a need for a method of manufacturing low-cost EL lamp systems which can be applied to both graphics and price-sensitive consumer applications.

SUMMARY OF THE INVENTION

The present invention is directed to the method for manufacturing EL lamp systems which incorporate some of the processes which have been used in manufacturing flexible, printed circuit boards with surface mounted components. In the exemplary embodiment of the invention, the method of the present invention includes the following steps. In the first step, a metal foil is bonded to an insulating carrier made of any insulating material, such as plastic or paper. The metal foil is then dye-cut or chemically etched to form a number of rear capacitive electrodes with a series of bus bars and foil traces. The foil traces being for mounting the electrical components and/or power supply.

Next, the insulating carrier stock is coupled to a precisely-positioned indexing system. In the preferred embodiment, the indexing system may include sprocket holes along one or more edges of the insulating carrier.

Next, a dielectric is applied to the rear capacitive electrodes. The dielectric is applied to bleed beyond the edge of each rear capacitive electrode to provide insulation between the rear capacitive and front capacitive electrodes.

In the next step, a layer of hygrophobically compounded high dielectric strength EL phosphor ink is applied to the dielectric layer to precisely form the area or areas of illumination. For an alternative lower cost product, the step of applying the dielectric layer above can be eliminated, and the EL phosphor ink is applied directly to the rear capacitive electrodes and allowed to bleed past the edges of the rear capacitive electrodes, thereby providing insulation between the front and rear capacitive electrodes.

In the next step, a conductive adhesive or solder paste is applied to the bus bars for the purpose of acting as an a interface between the bus bars and the Indium Tin Oxide (ITO) front electrode.

Then, a layer of transparent or translucent conductive ITO film or ink is applied to cover the rear capacitive electrodes and bus bars, thereby, forming front capacitive electrodes. Contact areas are left exposed on the rear capacitive electrodes and bus bars.

The next step, alternatively would be the application of an insulating transparent polyester or ultra-violet activated dielectric is applied over the ITO inks and bus bars, but not the exposed contact areas. In the instance where the ITO is plated on one side of polyester film, then the adding of this layer is unnecessary. Further, this layer becomes important for those instances of higher voltage to protect and insulate. In instances where a final insulating conformal coating is applied at the end of the process, the addition of a separate polyester layer may prove unnecessary in the lower power and lower cost systems.

Next, electrical components are mounted on the exposed contact areas of the traces by the use of the of conductive adhesives or solder pastes.

The electrical components can be controllers with inverters or just inverters, as well as inverters with battery or solar cell power supplies. The electrical controllers can be microprocessors for controlling a single or a plurality of EL Lamps, as well as the controllers being a transistor that is a simple timing circuit. The controllers would be connected to power supplies by attaching power supplies to the traces by means of conductive adhesives and solder pastes.

The next steps is the conformal coating of the surface of the entire carrier with an environmental isolating compound that electrical insulates and is transparent or translucent. The final step is the die cutting of the requisite EL lamp system desired.

The surface mounted components can permit the continuous manufacture of EL Animation displays and alphanumeric displays for appliances. The continuous manufacture in this fashion would permit an almost limitless ability to create low cost EL Lamp Systems.

The method of the present invention provides the ability to manufacture EL lamp systems at a significantly reduced cost.

Further features and advantages of the present invention will be appreciated by a review of the following detailed description of the preferred embodiments taken in conjunction with the following drawings.

BRIEF DESCRIPTION OF THE DRAWINGS

The present invention may be best understood by referring to the following detailed description of the preferred embodiments and the accompanying drawings, wherein like numerals denote like elements and in which.

DETAILED DESCRIPTION OF THE PREFERRED EMBODIMENT

The following exemplary discussion focuses on the manufacture of a low-cost electroluminescence (EL) lamp system. The EL lamp system produced by the method of the present invention is suitable for a variety of graphics and low-cost consumer applications. Referring to FIGS. 1 through 10 illustrate the sequence of process steps for a preferred method of manufacture for a EL lamp system in accordance with the present invention.

Figure 1:
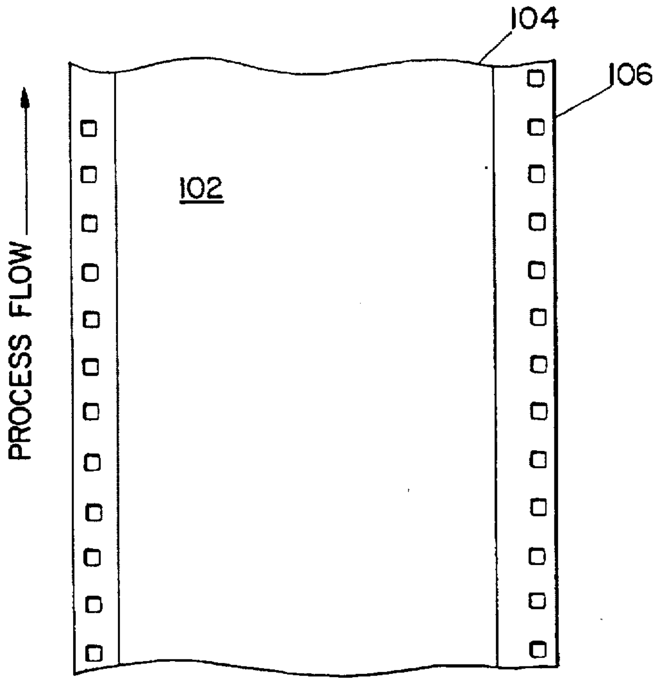
FIG. 1. illustrates the first step of the process of the current invention.
Figure 2:
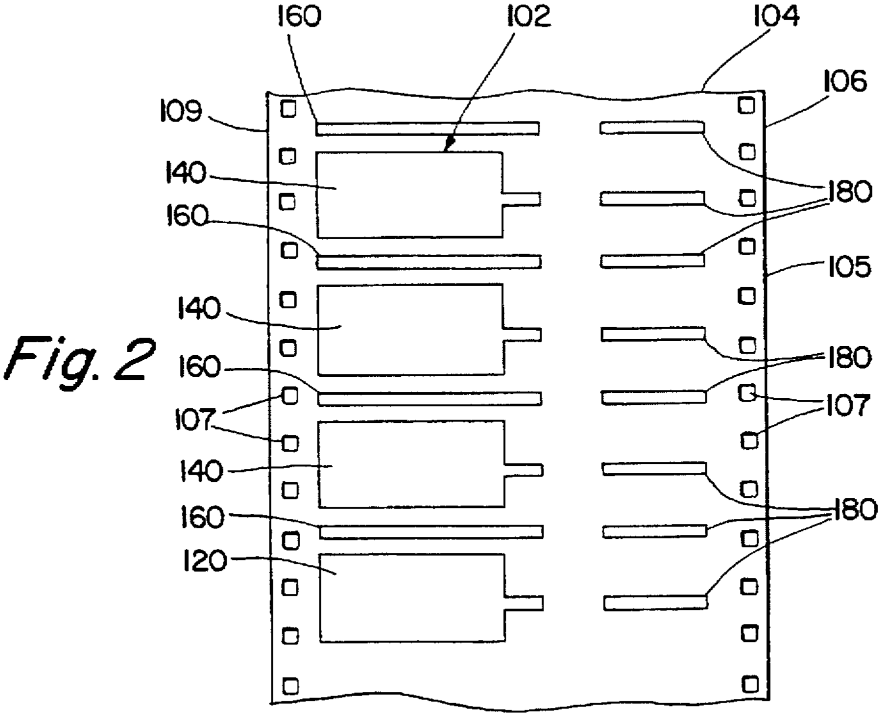
FIG. 2. illustrates the second step of the process of the current invention.

In the first step of the method, as shown in FIG. 1, illustrates a conductive foil 102 bonded on a carrier material 104 that could either be a paper or flexible plastic or composite material with a webbing. The foil 102 is approximately 0.002 inch thick. In step two illustrated in FIG. 2, the conductive foil is dye-cut or chemically etched to form one or more rear capacitive electrodes 140, bus bars 160 and traces 180. The conductive foil capacitive, bus bar and trace areas could also have been adhesively bonded continuously on the carrier 104 or plated or laminated in sequences.

Typical thickness of the carrier core stock 104 is approximately 0.01 inch. The dye cutting or chemical etching may be done using any number of conventional techniques. Additionally, the carrier stock 104 may be coupled to a conventional precision indexing system (not shown) with carrier web 106, having sprocket holes 107 which are provided along one or more edges 105 and 109 of the carrier stock 104.

Figure 3:
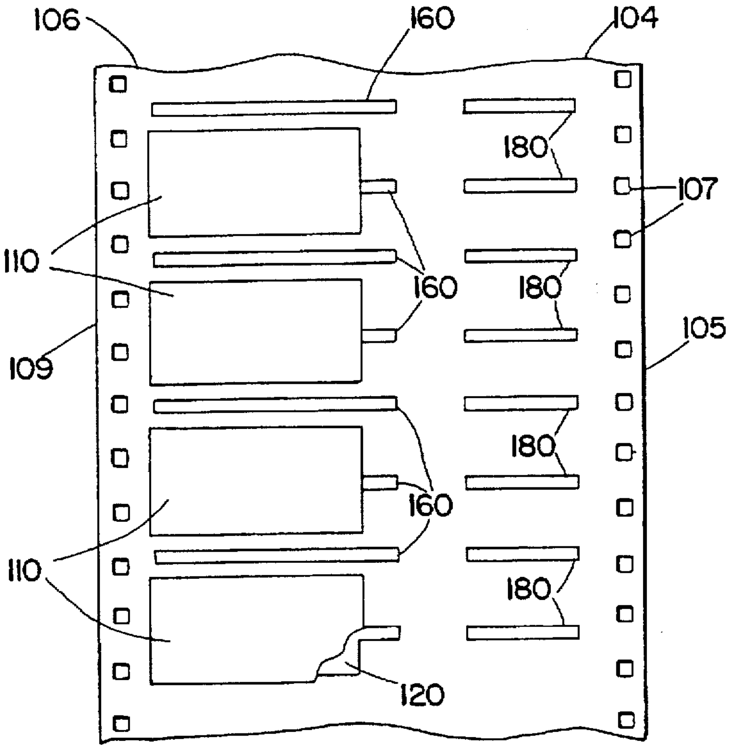
FIG. 3. illustrates the third step of the process of the current invention.
Figure 4:
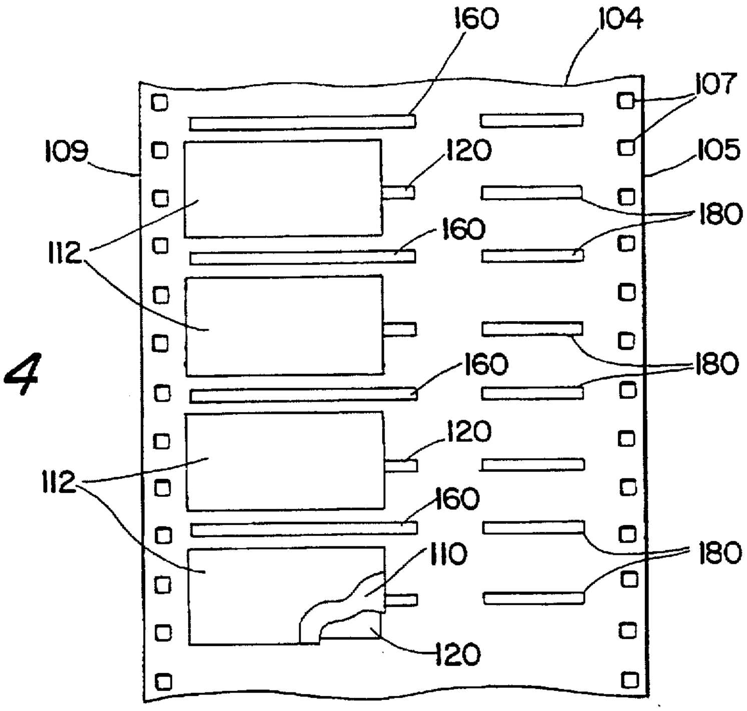
FIG. 4. illustrates the fourth step of the process of the current invention.

In the next step, as shown in FIG. 3, a dielectric 110 is applied to the rear capacitive electrodes. Then as shown in FIG. 4, a layer of EL phosphor ink layer 112 is applied to rear capacitive electrodes 120 to precisely form the areas of illumination desired. In an alternative construction without the dielectric, the EL phosphor ink layer 112 is allowed to bleed past the edges of rear capacitive electrodes 120 by approximately 0.02 inch, thereby insulating rear capacitive electrodes 120.

Figure 5:
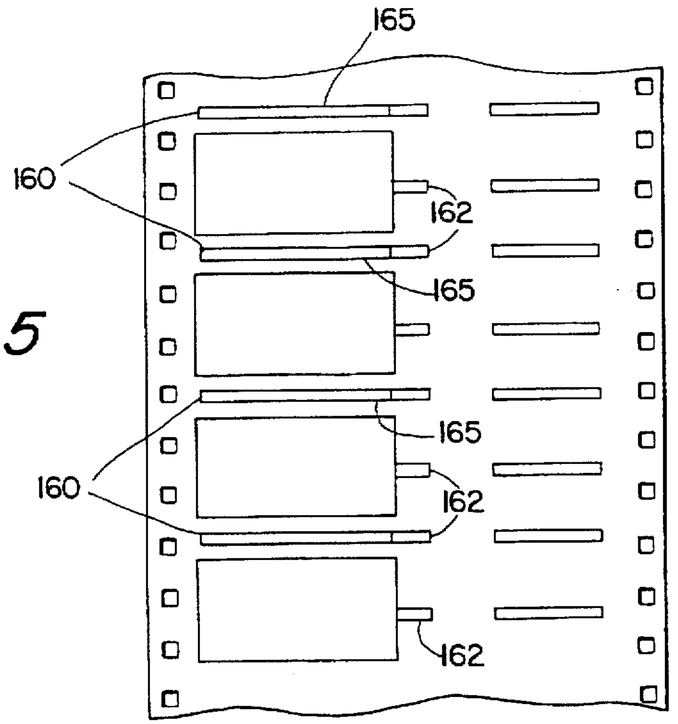
FIG. 5. illustrates the fifth step of the process of the current invention.
Figure 6:
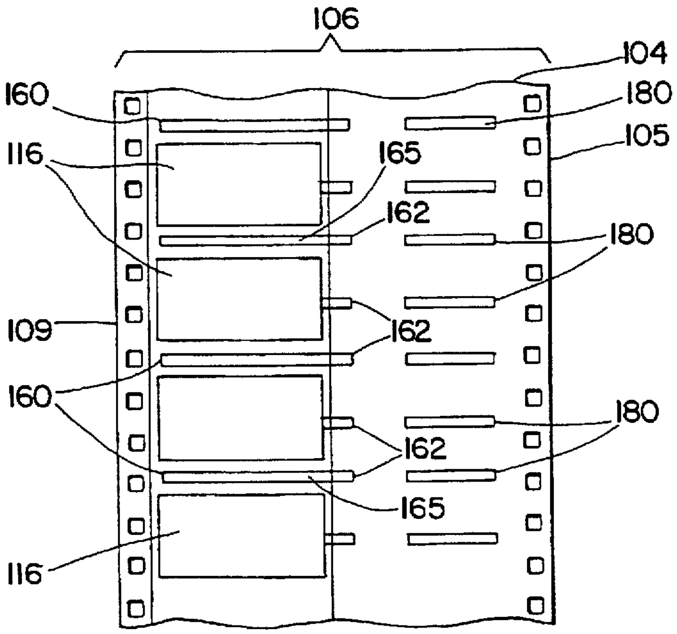
FIG. 6. illustrates the sixth step of the process of the current invention.

In the next step, as shown in FIG. 5, a conductive adhesive 165 is applied to bus bars 160 leaving contact areas 162 exposed. Then as shown in FIG. 6, a layer of conductive ITO ink 116 is then applied to cover the layer of EL phosphor ink 112, with ITO ink layer 116. And the areas of bus bars 160 having conductive adhesive 165, still leaving contact areas 162 exposed. The use of the precision indexing system can allow for the precise distribution of the layers of EL phosphor ink 112 and conductive ITO ink layer 116 to be specifically limited to those areas capacitive electrodes 120 which are to be illuminated. For example, complex graphical patterns such as circles within circles, text or individually addressable lamp elements (pixels) may be created.

Figure 7:
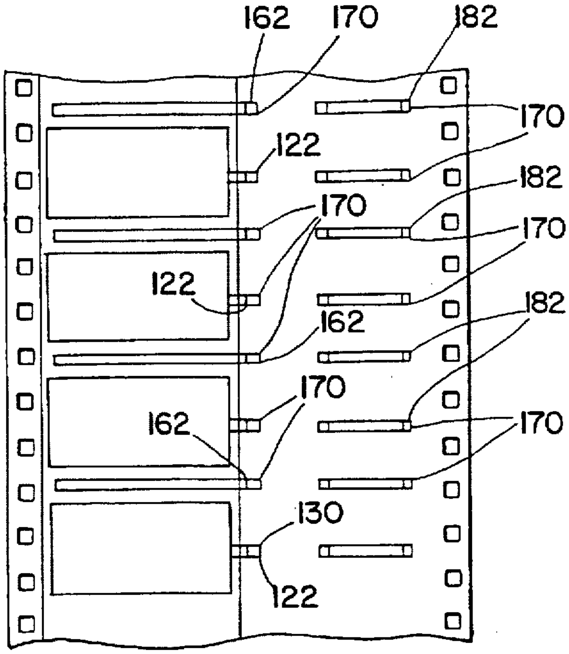
FIG. 7. illustrates the seventh step of the process of the current invention.
Figure 8:
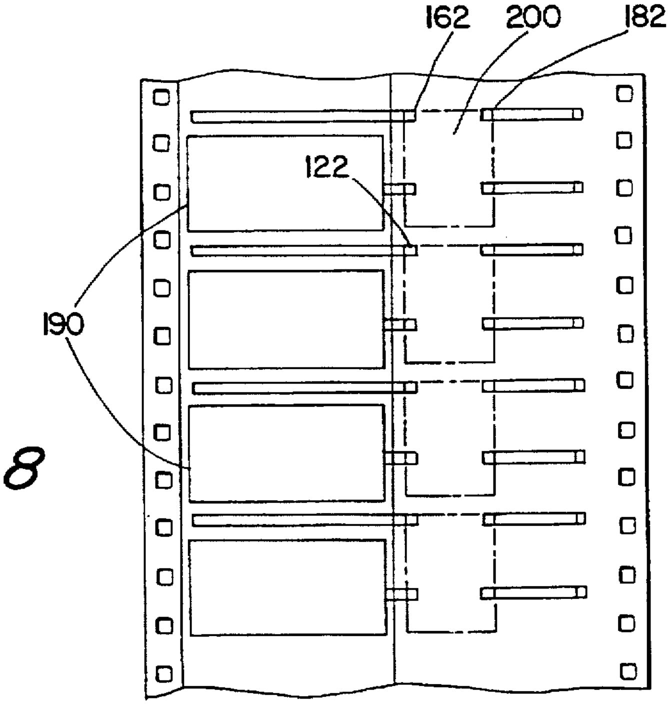
FIG. 8. illustrates the eighth step of the process of the current invention.

Continuing with FIG. 7, conductive adhesive 170 is applied to contact areas 122 on rear capacitive electrodes 120, contact areas 162 on the bus bars 160 and contact areas 182 and 186 on traces. Then as shown in FIG. 8, electrical components 200 are mounted to contact areas 122, 162 and 182. The electrical components can be controllers with inverters to control the sequence of lumination of a plurality of EL Lamps 190 or a single EL Lamp. The components can be a microprocessor, a transistor having an inverter circuit, a battery or solar cell power supply with inverter circuit, or a controller design for the desired illumination effect desired, such as animation or sequence lighting to produce a pattern. Then, the conductive adhesive is cured or the solder paste is re-flowed.

Figure 9:
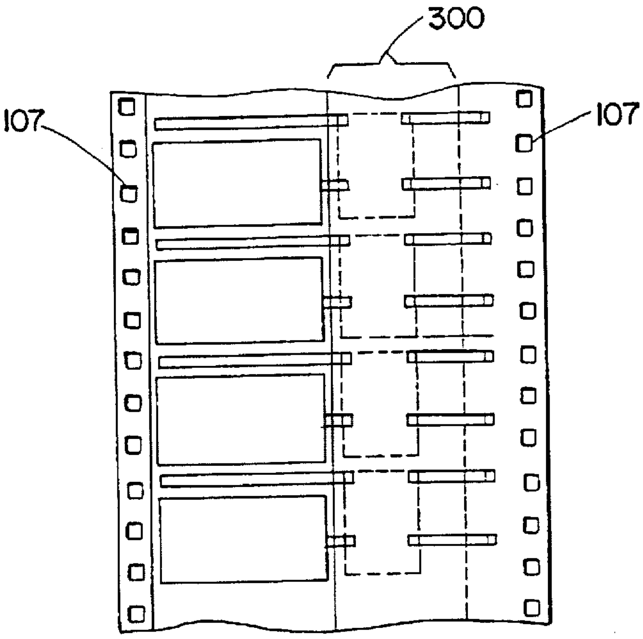
FIG. 9. illustrates the ninth step of the process of the current invention.
Figure 10:
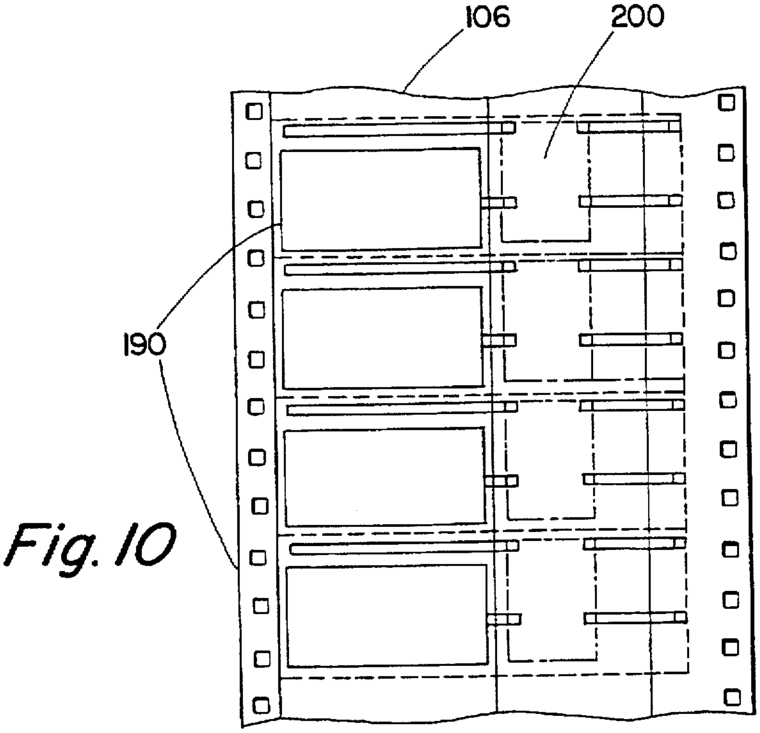
FIG. 10. illustrates the tenth step of the process of the current invention.

The next step as shown in FIG. 9, has a environmentally isolating and electrical insulating conformal coating 300 applied to the entire surface of the carrier bounded by sprocket holes 107. Continuing in FIG. 10, the sequence of EL lamps 190 and surface mounted components 200 are die cut form the carrier web 106.

Figure 11:
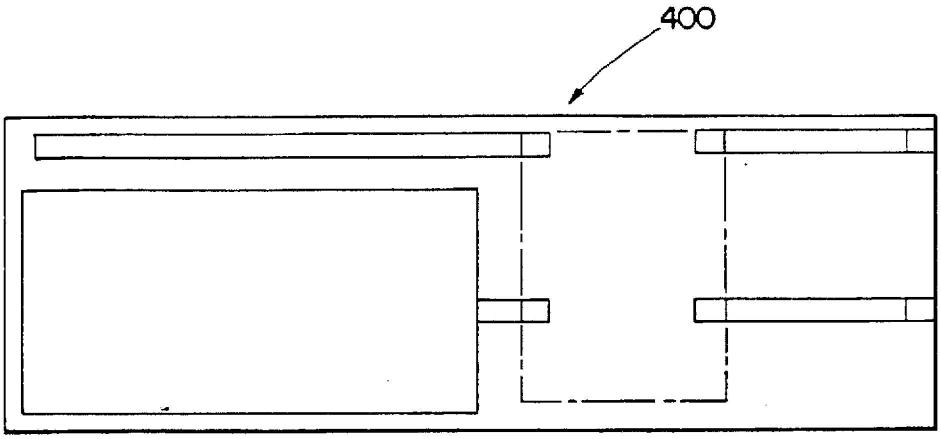
FIG. 11. illustrates a EL Lamp System produced by the current invention.
Figure 12:
FIG. 12. Illustrates the equavalent circuit for a parrellel plate EL Lamp.
Figure 13:
FIG. 13. Illustrates the equavalent circuit for a rear split electrode EL Lamp.

FIG. 11 illustrates a finished EL Lamp System 400 from the current invention. FIG. 12 shown and equivalent circuit for a lamp constructed as above being of parallel plate construction. The above process can be used to make split electrode EL lamps by not producing bus bars 180 and contact made to at least two of the rear electrodes 120 with a power supply with or without a component 200. FIG. 13 illustrates an equivalent circuit for a split electrode construction.

The foregoing description includes what are present considered to be preferred embodiments of the invention. Obviously, however, it will be readily apparent to those skilled in the art that various changes and modifications may be made to the embodiments without departing from the spirit and scope of the invention. Accordingly, it is intended that such changes and modifications fall within the spirit and scope of the invention, and that the invention be limited only by the following claims:

I claim:

1. A method for manufacturing an electroluminescent (EL) lamp system comprised of multiple electroluminescent lamps, said method comprising the steps of:

bonding a continuous conductive foil to the surface of one side of a continuous length non-conductive carrier;

removing sections of the foil from the surface of said carrier resulting in a plurality of capacitive electrodes;

applying a layer of electroluminescent phosphor ink to said capacitative electrodes, said electroluminescent phosphor ink for precisely defining at least one area of illumination;

applying a layer of Indium Tin Oxide to said layer of electroluminescent phosphor ink;

applying an insulating layer to at least said layer of electroluminescent phosphor ink;

attaching electrical terminations to said capacitive electrodes and said layer of conductive Indium Tin Oxide; and mounting at least one electrical component on said carrier for enabling illumination of said at least one area of illumination, wherein said at least one electrical component is electrically connected to said electrical terminations.

2. The method of claim 1, further comprising the application of a dielectric material to said plurality of capacitive electrodes prior to said application of electroluminescent phosphor ink.

3. The method of claim 1, wherein an insulating layer is applied to said layer of Indium Tin Oxide ink.

4. The method of claim 1, wherein an electrically insulating conformal coating is applied for water proofing said El Lamp System.

5. The method of claim 1, wherein said EL Lamp System is die cut from said continuous length carrier.

6. The method of claim 1, wherein said at least one electrical component is mountably connected to illuminate said areas of illumination.

7. The method of claim 1, wherein said layer of Indium Tin Oxide is applied either as an ink or as a film.

8. A method for manufacturing an electroluminescent lamp system, said method comprising the steps of:

forming a plurality of rear conductive capacitive electrodes on a continuous length carrier;

forming a plurality of conductive electrical contacts;

applying a layer of electroluminescent phosphor ink to said capacitive electrodes;

said electroluminescent phosphor ink precisely defining areas of illumination;

applying a layer of conductive Indium Tin Oxide ink to said layer of electroluminescent phosphor ink;

applying an insulating coating to said surface of said conductive Indium Tin Oxide ink; and mountably connecting electrical components for illuminating said areas of illumination, wherein said electrical components are electrically connected to said plurality of electrical contacts and to said plurality of conductive capacitative electrodes.

* * * * *